United States Patent
Oh et al.

(10) Patent No.: US 9,472,250 B1
(45) Date of Patent: Oct. 18, 2016

(54) SEMICONDUCTOR DEVICE AND OPERATING METHOD THEREOF

(71) Applicant: SK hynix Inc., Gyeonggi-do (KR)

(72) Inventors: Seung-Wook Oh, Gyeonggi-do (KR); Jeong-Tae Hwang, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/939,752

(22) Filed: Nov. 12, 2015

(30) Foreign Application Priority Data

Jun. 17, 2015 (KR) .................. 10-2015-0085735

(51) Int. Cl.
- *G11C 7/10* (2006.01)
- *G11C 7/08* (2006.01)
- *G11C 29/56* (2006.01)

(52) U.S. Cl.
CPC .............. *G11C 7/109* (2013.01); *G11C 7/08* (2013.01); *G11C 29/56012* (2013.01)

(58) Field of Classification Search
CPC .... G11C 7/109; G11C 7/08; G11C 29/56012
USPC ................... 365/189.01, 189.05, 189.07
See application file for complete search history.

(56) References Cited

U.S. PATENT DOCUMENTS

| | | | | |
|---|---|---|---|---|
| 6,009,495 A * | 12/1999 | DeRoo | ................ | G06F 9/30101 711/103 |
| 6,172,935 B1 * | 1/2001 | Wright | ................ | G11C 7/1072 365/194 |
| 7,751,272 B2 * | 7/2010 | Pyeon | ................ | G11C 19/00 365/230.03 |
| 8,046,648 B1 * | 10/2011 | Russell | ............ | G01R 31/31701 714/724 |
| 9,165,678 B2 * | 10/2015 | Jeong | ................ | G11C 29/00 |
| 2001/0050575 A1 * | 12/2001 | Weng | ............... | G01R 31/31915 324/750.3 |
| 2004/0008560 A1 * | 1/2004 | Aoki | ................ | G11C 29/14 365/222 |
| 2006/0018165 A1 * | 1/2006 | Szczypinski | ......... | G11C 7/1078 365/189.05 |
| 2007/0124566 A1 * | 5/2007 | Cohen | ................ | G06F 9/30181 712/208 |
| 2008/0005647 A1 * | 1/2008 | Bains | ................ | G06F 11/1004 714/781 |
| 2008/0250262 A1 * | 10/2008 | Kim | ................ | G11C 7/1078 713/400 |
| 2009/0063916 A1 * | 3/2009 | Vogelsang | ......... | G11C 29/4401 714/719 |
| 2010/0074031 A1 * | 3/2010 | Kim | ................ | G11C 29/46 365/189.05 |

FOREIGN PATENT DOCUMENTS

KR     1020120070436     6/2012

* cited by examiner

*Primary Examiner* — Viet Q Nguyen

(74) *Attorney, Agent, or Firm* — IP & T Group LLP

(57) ABSTRACT

A semiconductor device including an input unit suitable for transferring external command signals provided from an external device to an internal device and a detection unit suitable for detecting a predetermined command signal among the external command signals, and restricting the transfer of the detected command signal.

12 Claims, 3 Drawing Sheets

SEMICONDUCTOR DEVICE AND OPERATING METHOD THEREOF

CROSS-REFERENCE TO RELATED APPLICATIONS

The present application claims priority of Korean Patent Application No. 10-2015-0085735, filed on Jun. 17, 2015, which is incorporated herein by reference in its entirety.

BACKGROUND

1. Field

Exemplary embodiments of the present invention relate to a semiconductor design technology, and more particularly, to a semiconductor device which performs a circuit operation according to a command inputted from outside.

2. Description of the Related Art

In general, a semiconductor memory device including double data rate synchronous DRAM (DDR SDRAM) receives various command signals from outside and performs various operations corresponding to the command signals. For example, the semiconductor memory device may perform an active operation, a precharge operation, a write operation, and a read operation in response to the external command signals. The external command signals inputted to the semiconductor memory device may include a chip select signal, a row address strobe (RAS) signal, a column address strobe (CAS) signal, a write enable signal and the like.

SUMMARY

Various embodiments are directed to a semiconductor device capable of avoiding an operation corresponding to an undesired external command signal among external command signals the undesired external command signal.

In an embodiment, a semiconductor device may include an input unit suitable for transferring external command signals provided from an external device to an internal device; and a detection unit suitable for detecting a predetermined command signal among the external command signals, and restricting the transfer of the detected command signal.

The detection unit may include a storage unit suitable for storing information of the predetermined command signal; and a comparison unit suitable for comparing the predetermined command signal stored in the storage unit to the external command signal provided from the external device, and generating a control signal for controlling whether to activate the input unit.

In an embodiment, a semiconductor device may include a buffering unit suitable for buffering external command signals provided from an external device; a decoding unit suitable for decoding the buffered external command signals; and a detection unit suitable for detecting a predetermined command signal among the external command signals, and restricting the decoding of the detected command signal.

The detection unit may include a storage unit suitable for storing information of the predetermined command signal; and a comparison unit suitable for comparing the predetermined command signal stored in the storage unit to the external command signal provided from the external device, and generating a control signal for controlling whether to activate the decoding unit.

The semiconductor device may further comprise a blocking unit suitable for blocking one or more of output terminals of the decoding unit according to a result of the detection.

In an embodiment, an operating method of a semiconductor device may include performing circuit operations in response to external command signals during a first operation; detecting a predetermined command signal among the external command signals during a second operation; and restricting an operation corresponding to the detected predetermined command signal during the second operation.

The operating method may further comprise performing an operation corresponding to the predetermined command signal during the first operation.

The first operation may be a normal operation, and the second operation is a training test operation.

The restricting of the operation corresponding to the detected predetermined command signal may comprise restricting transfer of the detected predetermined command signal from an external device to an internal device.

The operating method may further comprise decoding the external command signals.

The restricting of the operation corresponding to the detected predetermined command signal may comprise restricting the decoding of the detected predetermined command signal.

The restricting of the operation corresponding to the detected predetermined command signal may comprise blocking a result of the decoding of the detected predetermined command signal.

In an embodiment, a semiconductor system may include a semiconductor device suitable for performing a circuit operation in response to an external command signal, and providing command information corresponding to a predetermined command signal; and a controller suitable for generating the external command signal to control the semiconductor device, and restricting a generation operation for the predetermined command signal based on the command information.

The controller may comprise a command generation unit suitable for generating the external command signal based on the command information.

The semiconductor device may comprise a storage unit suitable for storing the command information.

The command information may further comprise operation information of the semiconductor device.

The semiconductor device in accordance with the embodiment of the present invention can detect an undesired external command signal among external command signals and avoid an operation corresponding to the undesired external command signal. Thus, the semiconductor device can perform only a predetermined operation.

DETAILED DESCRIPTION

Figure 1:
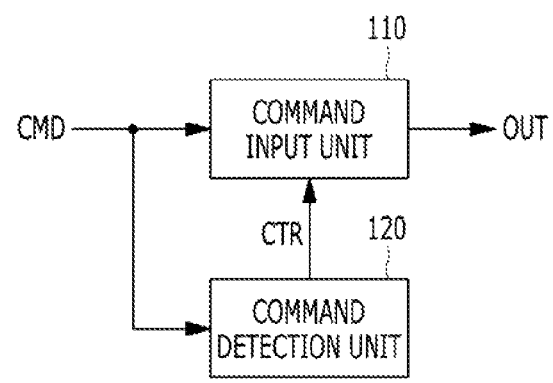
FIG. 1 is a block diagram illustrating a semiconductor device in accordance with an embodiment of the present invention.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

FIG. 1 is a block diagram illustrating a semiconductor device in accordance with an embodiment of the present invention.

Referring to FIG. 1, the semiconductor device may include a command input unit 110 and a command detection unit 120.

The command input unit 110 transfers an external command signal CMD to the semiconductor device. The transfer operation of the command input unit 110 is controlled by a control signal CTR. The transfer control of the command signal CMD by the control signal CTR means an activation control of the command input unit 110 by the control signal CTR. When the command input unit 110 is activated, the external command signal CMD is transferred to the semiconductor device through an output terminal OUT of the command input unit 110. When the command input unit 110 is deactivated, the external command signal CMD may not be transferred to the semiconductor device.

The command detection unit 120 detects an abnormal external command signal CMD among external command signals CMD, and generates a control signal CTR corresponding to the detection of the abnormal external command signal CMD. When an external command signal CMD is abnormal, the command detection unit 120 generates the control signal CTR for deactivating the command input unit 110. Otherwise, the command detection unit 120 generates the control signal CTR for activating the command input unit 110.

The semiconductor device in accordance with the embodiment of the present invention detects an abnormal external command signal CMD, and blocks input of the detected abnormal command signal CMD. Thus, the semiconductor device may not perform an operation in response to the abnormal command signal CMD.

Figure 2:
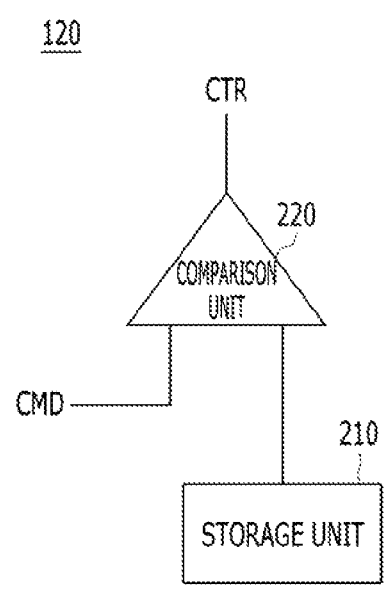
FIG. 2 is a block diagram illustrating a command detection unit.

FIG. 2 is a block diagram illustrating the command detection unit 120 of FIG. 1.

Referring to FIG. 2, the command detection unit 120 may include a storage unit 210 and a comparison unit 220.

The storage unit 210 stores an abnormal command signal CMD. The comparison unit 220 generates the control signal CTR by comparing the inputted external command signal CMD to the stored abnormal command signal of the storage unit 210.

When the external command signal CMD is equal to the abnormal command signal stored in the storage unit 210, the command detection unit 120 generates the control signal CTR for deactivating the command input unit 110. Otherwise, the command detection unit 120 generates the control signal CTR for activating the command input unit 110.

Figure 3:
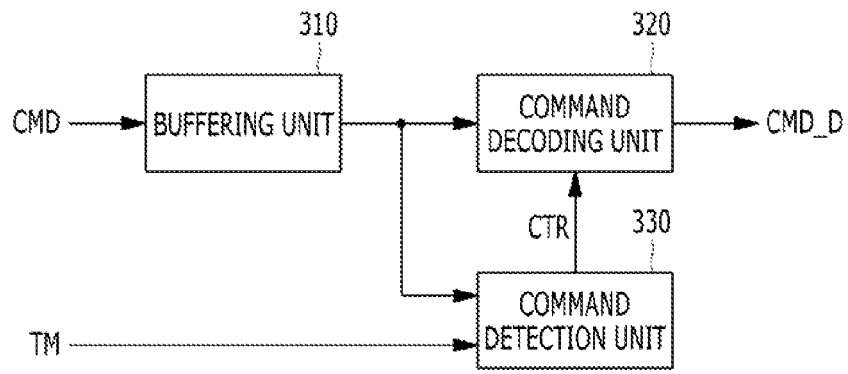
FIG. 3 is a block diagram illustrating a memory device in accordance with another embodiment of the present invention.

FIG. 3 is a block diagram illustrating a memory device in accordance with another embodiment of the present invention.

Referring to FIG. 3, the semiconductor device may include a buffering unit 310, a command decoding unit 320, and a command detection unit 330.

The buffering unit 310 receives an external command signal CMD and buffers the received external command signal CMD.

The command decoding unit 320 decodes the external command signal CMD outputted from the buffering unit 310. The decoding operation is controlled by the control signal CTR which will be described below. The decoding control of the external command signal CMD by the control signal CTR means an activation control of the command decoding unit 320 by the control signal CTR. The decoded command signal CMD_D outputted from the command decoding unit 320 may be provided to an internal circuit which requires the decoded command signal CMD_D.

The command detection unit 330 detects an abnormal external command signal CMD among external command signals CMD, and generates the control signal CTR corresponding to the detection of the abnormal external command signal CMD. When an external command signal CMD is abnormal, the command detection unit 330 generates the control signal CTR for deactivating the command decoding unit 320. Otherwise, the command detection unit 330 generates the control signal CTR for activating the command decoding unit 320.

The activation of the command detection unit 330 is controlled by a test signal TM which is activated during a predetermined test operation. This indicates that the command detection unit 330 can be activated only during the test operation. That is, the command detection unit 330 may be deactivated during a normal operation. However, the command detection unit 330 may be activated only during a test operation and detect the abnormal command signal CMD. This indicates that a decoding operation in response to the abnormal command signal CMD can be restricted only during the test operation. On the contrary, the command detection unit 330 may be activated during the normal operation by a test signal TM which is activated during the normal operation.

Figure 4:
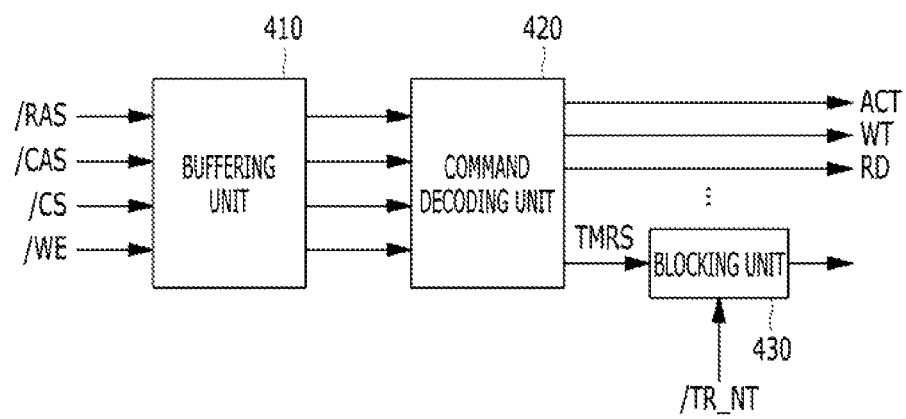
FIG. 4 is a block diagram illustrating a semiconductor device in accordance with another embodiment of the present invention.

FIG. 4 is a block diagram illustrating a semiconductor device in accordance with another embodiment of the present invention.

Referring to FIG. 4, the semiconductor device may include a buffering unit 410, a command decoding unit 420, and a blocking unit 430.

The buffering unit 410 receives a row address strobe signal/RAS, a column address strobe signal/CAS, a chip select signal/CS, and a write enable signal/WE, which are the external command signals CMDs, and buffers the received external command signals CMDs.

The command decoding unit 420 decodes the external command signal CMD provided from the buffering unit 410, and generates various internal command signals. The internal command signals may include an internal active command ACT, an internal write signal WT, an internal read signal RD, and a mode register setting signal TMRS.

The blocking unit 430 blocks the mode register setting signal TMRS in response to an entry signal/TR_NT, which is activated during a training test operation. That is, during a normal operation, the blocking unit 430 may be deactivated to pass the mode register setting signal TMRS. During the training test operation, the blocking unit 430 may be activated to block the mode register setting signal TMRS.

During a normal operation, the mode register setting signal TMRS is transmitted to an internal circuit, and the internal circuit can perform an operation for setting a circuit related to a mode register in response to the mode register setting signal TMRS.

Figure 5:
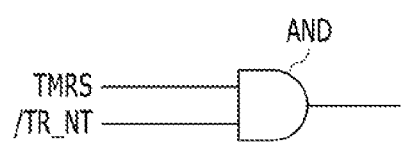
FIG. 5 is a block diagram illustrating a blocking unit.

FIG. 5 is a block diagram illustrating the blocking unit 430 of FIG. 4.

Referring to FIG. 5, the blocking unit 430 controls whether to block the mode register setting signal TMRS in response to the entry signal/TR_NT, and includes an AND gate AND for receiving the mode register setting signal TMRS and the entry signal/TR_NT. During a normal operation, the entry signal/TR_NT is set to a logic high level in order to pass the mode register setting signal TMRS. During the training test operation, the entry signal/TR_NT is set to a logic low level in order to block the mode register setting signal TMRS.

The semiconductor device in accordance with the embodiment of the present invention blocks the mode register setting signal TMRS or a specific command signal during the training test operation, which makes it possible to block an unexpected malfunction.

Figure 6:
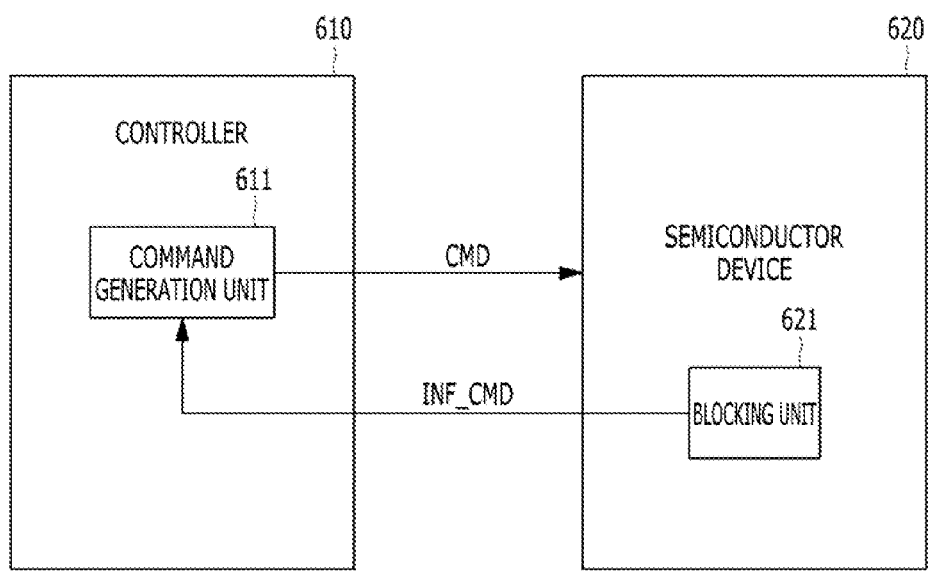
FIG. 6 is a block diagram illustrating a semiconductor system in accordance with another embodiment of the present invention.

FIG. 6 is a block diagram illustrating a semiconductor system in accordance with another embodiment of the present invention.

Referring to FIG. 6, the semiconductor system may include a controller 610 and a semiconductor device 620.

The controller 610 serves to control the semiconductor device 620, and transmits and receives various signals to and from the semiconductor device 620. For example, the controller 610 controls a read/write operation of the semiconductor device 620. In this case, the controller 610 and the semiconductor device 620 can transmit or receive an external command signal CMD, an address signal (not illustrated), and a data signal (not illustrated). The semiconductor device 620 may perform a predetermined circuit operation in response to the external command signal CMD.

The semiconductor device 620 may include a storage unit 621 for storing command information INF_CMD of an abnormal command signal, and provides the command information INF_CMD stored in the storage unit 621 to the controller 610. The controller 610 may include a command generation unit 611 for generating the external command signal CMD, and restricts a generation operation for the external command signal CMD in response to the command information INF_CMD.

The semiconductor device 620 provides information of an abnormal command signal to the controller 610 through the command information INF_CMD, and the controller 610 generates an external command signal CMD excluding the abnormal command signal according to the command information INF_CMD. Thus, the semiconductor device 620 can perform only a desired operation in response to the external command signal CMD.

The command information INF_CMD may include various pieces of information. In particular, the command information INF_CMD may include operation information of the semiconductor device 620. For example, the semiconductor device 620 may perform a normal operation and a test operation. Furthermore, the semiconductor device 620 may not normally operate an operation in response to a command signal A during the normal operation, and not normally operate an operation in response to a command signal B during the test operation. Thus, the semiconductor device 620 may provide the operation information of the semiconductor device 620 and information containing a predetermined command signal corresponding to the operation information to the controller 610 through the command information INF_CMD. Then, the semiconductor device 620 may request the controller 610 to restrict a generation operation for the command signal A during the normal operation, and request the controller 610 to restrict a generation operation for the command signal B during the test operation.

In the semiconductor system in accordance with the embodiment of the present invention, the semiconductor device 620 can provide the command information INF_CMD to the controller 610, and the controller 610 can generate the external command signal CMD according to the command information INF_CMD.

As described above, the semiconductor device in accordance with the embodiment of the present invention can restrict an operation corresponding to a predetermined command signal among external command signals, and perform only a normal operation at all times. Furthermore, such an operation of the semiconductor device can increase the reliability of the normal operation and the test operation for the semiconductor device.

Since the semiconductor device does not perform an unnecessary operation, the operation reliability of the semiconductor device can be improved.

Although various embodiments have been described for illustrative purposes, it will be apparent to those skilled in the art that various changes and modifications may be made without departing from the spirit and scope of the invention as defined in the following claims.

For example, the positions and types of the logic gates and transistors used in the above-described embodiments may be set in different manners according to the polarities of input signals.

What is claimed is:

1. A semiconductor device comprising:
   an input unit suitable for transferring external command signals provided from an external device to an internal device; and
   a detection unit suitable for detecting a predetermined command signal among the external command signals, and restricting the transfer of the detected command signal,
   wherein the detection unit comprises:
   a storage unit suitable for storing information of the predetermined command signal; and
   a comparison unit suitable for comparing the predetermined command signal stored in the storage unit to the external command signal provided from the external device, and generating a control signal for controlling whether to activate the input unit.

2. A semiconductor device comprising:
   a buffering unit suitable for buffering external command signals provided from an external device;
   a decoding unit suitable for decoding the buffered external command signals; and
   a detection unit suitable for detecting a predetermined command signal among the external command signals, and restricting the decoding of the detected command signal,
   wherein the detection unit comprises:
   a storage unit suitable for storing information of the predetermined command signal; and
   a comparison unit suitable for comparing the predetermined command signal stored in the storage unit to the external command signal provided from the external device, and generating a control signal for controlling whether to activate the decoding unit.

3. The semiconductor device of claim 2, further comprising a blocking unit suitable for blocking one or more of output terminals of the decoding unit according to a result of the detection.

4. An operating method of a semiconductor device, comprising:
    performing circuit operations in response to external command signals during a first operation;
    detecting a predetermined command signal among the external command signals during a second operation; and
    restricting an operation corresponding to the detected predetermined command signal during the second operation,
    wherein the first operation is a normal operation, and the second operation is a training test operation.

5. The operating method of claim 4, further comprising performing an operation corresponding to the predetermined command signal during the first operation.

6. The operating method of claim 4, wherein the restricting of the operation corresponding to the detected predetermined command signal comprises restricting transfer of the detected predetermined command signal from an external device to an internal device.

7. The operating method of claim 4, further comprising decoding the external command signals.

8. The operating method of claim 7, wherein the restricting of the operation corresponding to the detected predetermined command signal comprises restricting the decoding of the detected predetermined command signal.

9. The operating method of claim 7, wherein the restricting of the operation corresponding to the detected predetermined command signal comprises blocking a result of the decoding of the detected predetermined command signal.

10. A semiconductor system comprising:
    a semiconductor device suitable for performing a circuit operation in response to an external command signal, and providing command information corresponding to a predetermined command signal; and
    a controller suitable for generating the external command signal to control the semiconductor device, and restricting a generation operation for the predetermined command signal based on the command information,
    wherein the semiconductor device comprises a storage unit suitable for storing the command information.

11. The semiconductor system of claim 10, wherein the controller comprises a command generation unit suitable for generating the external command signal based on the command information.

12. The semiconductor system of claim 10, wherein the command information further comprises operation information of the semiconductor device.

* * * * *